(12) United States Patent
Park et al.

(10) Patent No.: US 10,008,410 B2
(45) Date of Patent: Jun. 26, 2018

(54) DEPOSITION APPARATUS INCLUDING UV ANNEALING UNIT AND METHOD FOR FABRICATING NON-VOLATILE MEMORY DEVICE BY USING THE DEPOSITION APPARATUS

(71) Applicants: Kwang Chul Park, Suwon-si (KR); Ji Woon Im, Hwaseong-si (KR); Dai Hong Kim, Hwaseong-si (KR); Il Woo Kim, Hwaseong-si (KR); Hyun Seok Lim, Suwon-si (KR)

(72) Inventors: Kwang Chul Park, Suwon-si (KR); Ji Woon Im, Hwaseong-si (KR); Dai Hong Kim, Hwaseong-si (KR); Il Woo Kim, Hwaseong-si (KR); Hyun Seok Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/464,532

(22) Filed: Mar. 21, 2017

(65) Prior Publication Data

US 2018/0114722 A1 Apr. 26, 2018

(30) Foreign Application Priority Data

Oct. 25, 2016 (KR) .................... 10-2016-0138939

(51) Int. Cl.
*H01L 21/768* (2006.01)
*H01L 21/02* (2006.01)
(Continued)

(52) U.S. Cl.
CPC ...... *H01L 21/76825* (2013.01); *C23C 16/482* (2013.01); *C23C 16/50* (2013.01);
(Continued)

(58) Field of Classification Search
None
See application file for complete search history.

(56) References Cited

U.S. PATENT DOCUMENTS 7,265,061 B1 9/2007 Cho et al.
7,679,133 B2 3/2010 Son et al.
(Continued)

FOREIGN PATENT DOCUMENTS

KR 20160083049 A 7/2016
WO WO-2015065709 A1 5/2015

*Primary Examiner* — Bilkis Jahan
(74) *Attorney, Agent, or Firm* — Harness, Dickey & Pierce, P.L.C.

(57) ABSTRACT

A deposition apparatus includes a chamber, a plate in the chamber and configured support a substrate, a deposition unit configured to perform a deposition process in-situ in the chamber, and a UV annealing unit configured to perform a first ultraviolet (UV) and a second ultraviolet (UV) annealing process in-situ in the chamber. The deposition process may include sequentially depositing a first sacrificial layer, a first oxide layer, a second sacrificial layer and a second oxide layer on the substrate. The first UV annealing process may be performed on the first oxide layer after the first oxide layer is deposited. The second UV annealing process may be different from the first UV annealing process and may be performed on the second oxide layer after the second oxide layer is deposited.

20 Claims, 21 Drawing Sheets

(51) Int. Cl.
*H01L 21/311* (2006.01)
*H01L 21/28* (2006.01)
*H01L 27/1157* (2017.01)
*H01L 27/11582* (2017.01)
*C23C 16/48* (2006.01)
*C23C 16/50* (2006.01)
*C23C 16/54* (2006.01)

(52) U.S. Cl.
CPC ........ *C23C 16/54* (2013.01); *H01L 21/02164* (2013.01); *H01L 21/02348* (2013.01); *H01L 21/28282* (2013.01); *H01L 21/31111* (2013.01); *H01L 21/76802* (2013.01); *H01L 21/76877* (2013.01); *H01L 27/1157* (2013.01); *H01L 27/11582* (2013.01)

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,024,372 B2 | 5/2015 | Ahn et al. | |
| 9,147,691 B2 | 9/2015 | Sinha | |
| 9,245,969 B2 | 1/2016 | Hattori et al. | |
| 9,252,024 B2 | 2/2016 | Lam et al. | |
| 9,305,844 B2 | 4/2016 | Zhu et al. | |
| 9,378,962 B2 | 6/2016 | Hattori et al. | |
| 2001/0034097 A1* | 10/2001 | Lim | C23C 16/34 438/253 |
| 2010/0230741 A1* | 9/2010 | Choi | H01L 21/76229 257/324 |
| 2011/0233648 A1 | 9/2011 | Seol et al. | |
| 2013/0308392 A1* | 11/2013 | Nishijima | G11C 11/404 365/189.02 |
| 2014/0065842 A1* | 3/2014 | Anthis | H01L 21/0215 438/779 |
| 2015/0249010 A1 | 9/2015 | Kubota | |
| 2016/0260602 A1 | 9/2016 | Sreekala et al. | |

* cited by examiner

DEPOSITION APPARATUS INCLUDING UV ANNEALING UNIT AND METHOD FOR FABRICATING NON-VOLATILE MEMORY DEVICE BY USING THE DEPOSITION APPARATUS

This application claims priority from Korean Patent Application No. 10-2016-0138939 filed on Oct. 25, 2016 in the Korean Intellectual Property Office, the disclosure of which is incorporated herein by reference in its entirety.

BACKGROUND

1. Field

Inventive concepts relate to a deposition apparatus and/or a method for fabricating a non-volatile memory device using the deposition apparatus.

2. Description of Related Art

A semiconductor memory device is a memory device that is achieved by utilizing a semiconductor such as silicon (Si), germanium (Ge), gallium arsenide (GaAs) and indium phosphide (InP). The semiconductor memory device is largely divided into a volatile memory device and a non-volatile memory device. The volatile memory device is a memory device in which stored data disappears when a power supply is cut off. The volatile memory devices include a static RAM (SRAM), a dynamic RAM (DRAM), a synchronous DRAM (SDRAM) and the like. The non-volatile memory device is a memory device that holds the stored data even when a power supply is cut off. The non-volatile memory device may include a flash memory device, a read only memory (ROM), a programmable ROM (PROM), an electrically programmable ROM (EPROM), an electrically erasable and programmable ROM (EEPROM), a resistive memory device (e.g., a phase-change RAM (PRAM), a ferroelectric RAM (FRAM), and a resistive RAM (RRAM)) and the like.

Meanwhile, the degree of integration of the non-volatile memory device is increasing in order to satisfy the superior performance and low price demanded by consumers. However, in the case of a two-dimensional or planar memory device, the degree of integration is determined by an area occupied by unit memory cells. Therefore, recently, a three-dimensional memory device in which unit memory cells are disposed vertically has been developed.

For fabrication of such a three-dimensional memory device, a process of depositing a plurality of films on a substrate may be performed in advance. In the deposition process, an annealing process of activating the films by heating the substrate on which the films are deposited may be performed.

SUMMARY

An aspect of inventive concepts provides a deposition apparatus and a method of fabricating a non-volatile memory device using the same capable of improving leakage current characteristic and RC delay characteristic through reforming of an oxide layer, by additionally performing a UV annealing process at the time of fabricating a three-dimensional non-volatile memory device.

Another aspect of inventive concepts provides a deposition apparatus and a method of fabricating a non-volatile memory device using the same capable of fabricating a three-dimensional non-volatile memory device with reduced oxide layer thickness, by additionally performing a UV annealing process at the time of fabricating a three-dimensional non-volatile memory device.

The aspects of inventive concepts are not limited to those mentioned above and other aspects which are not mentioned will be clearly understood by those skilled in the art from the following description.

According some example embodiments of inventive concepts, a deposition apparatus includes a chamber, a plate, a deposition unit, and a UV annealing unit. The plate is in the chamber and configured to support the substrate. The deposition unit is configured to perform a deposition process that includes sequentially depositing a first sacrificial layer, a first oxide layer, a second sacrificial layer and a second oxide layer on the substrate. The UV annealing unit is configured to perform a first ultraviolet ray (UV) annealing process on the first oxide layer after the first oxide layer is deposited, and to perform a second UV annealing process different from the first UV annealing process on the second oxide layer after the second oxide layer is deposited. The first and second UV annealing processes are performed in-situ in the chamber.

According some example embodiments of inventive concepts, a method of fabricating a non-volatile memory device includes forming a first sacrificial layer on a substrate, forming a first oxide layer on the first sacrificial layer, performing a first UV annealing on the first oxide layer, forming a second sacrificial layer on the first oxide layer, forming a second oxide layer on the second sacrificial layer, performing a second UV annealing different from the first UV annealing on the second oxide layer, forming a channel hole that exposes the substrate by etching a first region of the first and second oxide layers and a first region of the first and second sacrificial layers, forming a channel pattern in the channel hole, forming a charge trap layer on the substrate adjacent to the channel pattern, forming a trench by etching a second region of the first and second oxide layers and a second region of the first and second sacrificial layers, and forming a gate electrode by removing the first and second sacrificial layers exposed by the trench. The trench is spaced apart from the channel pattern and exposes the substrate.

According to example embodiments, a deposition apparatus includes a chamber, a plate in the chamber, a deposition unit, and a UV annealing unit. The deposition unit and the UV annealing unit are configured to perform an in-situ process including a plurality of cycles on the substrate in the chamber. The plurality of cycles include a first cycle that includes depositing a first sacrificial layer on the substrate, depositing a first oxide layer on the first sacrificial layer, and performing a first annealing process on the substrate after the depositing the first oxide layer. The plurality of cycles include a second cycle that includes depositing an additional sacrificial layer on the first oxide layer, depositing an additional oxide layer on the additional sacrificial layer, and performing an additional annealing process on the substrate after the depositing the additional oxide layer. The additional annealing process is different than the first annealing process.

BRIEF DESCRIPTION OF THE DRAWINGS

The above and other aspects and features of inventive concept swill become more apparent by the description of the following drawings, in which.

DETAILED DESCRIPTION

Unless defined otherwise, all technical and scientific terms used herein have the same meaning as commonly understood by one of ordinary skill in the art to which inventive concepts belong. It is noted that the use of any and all examples, or example terms provided herein is intended merely to better illuminate inventive concepts and is not a limitation on the scope of inventive concepts unless otherwise specified. Further, unless defined otherwise, all terms defined in generally used dictionaries may not be overly interpreted.

In some example embodiments of inventive concepts, a three-dimensional (3D) memory array is provided. The three-dimensional memory array may be monolithically formed on one or more physical levels of a memory cell array which has a circuitry associated with the operation of the memory cell and an active region formed on a silicon substrate. The associated circuitry may be formed inside the substrate or on the substrate. The term 'monolithic' may mean that layers of each level of the array are directly deposited on layers of each lower level of the array.

In some example embodiments of inventive concepts, the three-dimensional memory array may include a 'vertical NAND string' in which at least one memory cell is disposed on another memory cell and vertically extends. At least one memory cell may include a charge trap layer. U.S. Registered Pat. Nos. 7,679,133, 8,553,466, 8,654,587, 8,559,235 and Publication of US Patent Application No. 2011/0233648 which are cited by reference describe an appropriate configuration of the three-dimensional memory array. The three-dimensional memory array may include bit lines and/or word lines shared between levels and a plurality of levels.

Hereinafter, a non-volatile memory device according to some example embodiments of inventive concepts will be described with reference to FIGS. 1 and 2.

Figure 1:
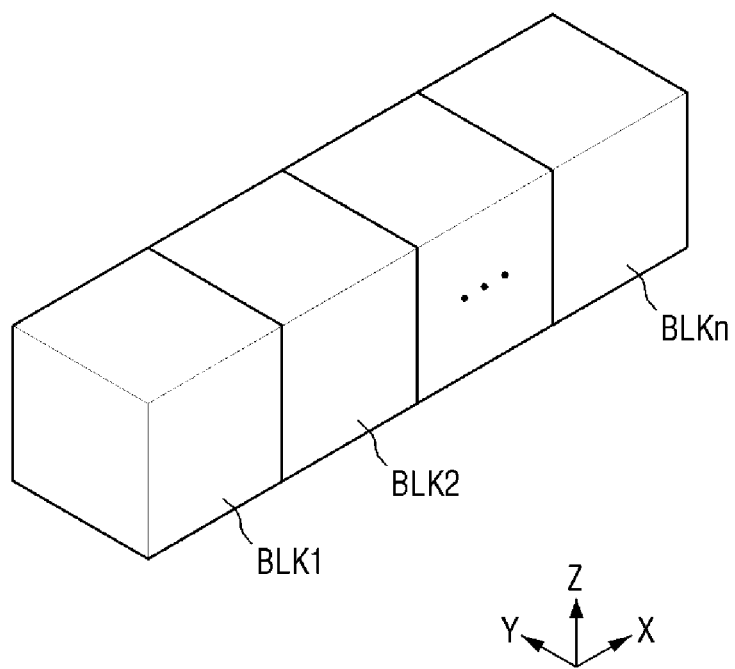
FIG. 1 is a conceptual diagram for explaining a non-volatile memory device according to some example embodiments of inventive concepts.

FIG. 1 is a conceptual diagram for explaining a non-volatile memory device according to some example embodiments of inventive concepts. FIG. 2 is a perspective view for explaining the memory block of FIG. 1.

Figure 2:
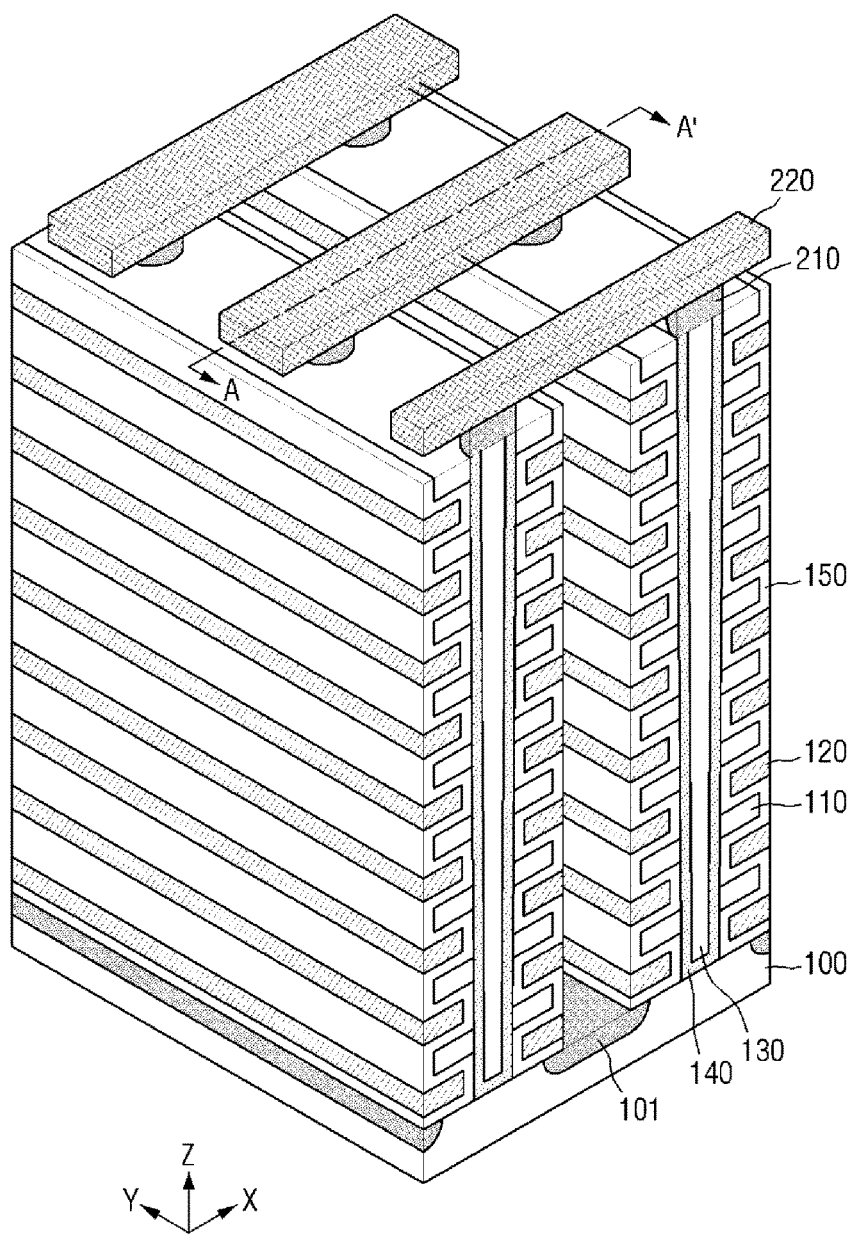
FIG. 2 is a perspective view for explaining the memory block of FIG. 1.

Referring to FIGS. 1 and 2, the memory array of the non-volatile memory device according to some example embodiments of inventive concepts may include a plurality of memory blocks (BLK1 to BLKn, where n is a natural number).

Each of the memory blocks BLK1 to BLKn may extend in the first to third directions x, y and z. The memory blocks BLK1 to BLKn may be three-dimensionally arranged. The x, y, z directions are directions intersecting with each other as illustrated, and may be different directions from each other. For example, the x, y and z directions may be directions intersecting with each other at right angles, but inventive concepts are not limited thereto.

The memory block (BLKi, where $1 \le i \le n$, and i is a natural number) has a substrate 100, a common source region 101, an oxide layer 110, a gate electrode 120, an inner layer 130, an outer layer 140, an insulating pattern 150, a drain 210, a bit line 220, and the like. The inner layer 130 and the outer layer 140 may also be referred to as channel patterns 130 and 140.

The substrate 100, for example, may be bulk silicon or silicon-on-insulator (SOI). Alternatively, the substrate 100 may be a silicon substrate or may contain other materials, for example, silicon germanium, indium antimonide, lead tellurium compounds, indium arsenide, indium phosphide, gallium arsenide or gallium antimonide. Alternatively, the substrate 100 may have an epitaxial layer formed on a base substrate.

The substrate 100 may include a common source region 101 which is provided for common source line.

The oxide layer 110 and the gate electrode 120 may be formed to be alternately laminated on the substrate 100. The oxide layer 110 and the gate electrode 120 may be formed to extend in the y-direction.

In some example embodiments, the oxide layer 110 may include silicon oxide ($SiO_2$) and low dielectric constant (low-k) material. The low dielectric constant material may be a material having a dielectric constant lower than silicon oxide.

The gate electrode 120 may include a conductive material. For example, the gate electrode 120 may include a conductive material such as tungsten (W), cobalt (Co) and nickel (Ni), or a semiconductor material such as silicon, but inventive concepts are not limited thereto. For example, the gate electrode 120 may not be a single level, and in the case of a multilayer structure, it may further include different conductive materials and insulating materials. The gate electrode 120 may operate as a word line.

The oxide layer 110 and the gate electrode 120, which extend in the y-direction on the substrate 100 and are alternately laminated in the z-direction, may include channel patterns 130 and 140 therein. In other words, the channel patterns 130 and 140 may be formed to penetrate through the oxide layer 110 and the gate electrode 120. The channel patterns 130 and 140 may have, for example, a pillar shape, but inventive concepts are not limited thereto. For example, the channel patterns 130 and 140 may, of course, have various shapes depending on the process.

The channel patterns 130 and 140 may include the inner layer 130 and the outer layer 140. The inner layer 130 may be formed on the substrate 100 to extend in the z-direction. The inner layer 130 may penetrate through the oxide layer 110 and the gate electrode 120 that are alternately laminated on the substrate 100.

The inner layer 130 may include an insulating material. For example, the inner layer 130 may be formed using poly silazane (PSZ), but inventive concepts are not limited thereto. For example, the inner layer 130 may be formed of an insulating material with high fluidity so that the remaining space of a channel hole (CHH of FIG. 14) to be described below can be filled without voids.

The outer layer 140 may be formed on the substrate 100 to wrap around the inner layer 130 along the outer periphery of the inner layer 130. The outer layer 140 may be formed between inner layer 130 and the oxide layer 110 and the gate electrode 120. The outer layer 140 may be formed on the substrate 100 to extend in the z-direction. The outer layer 140 may penetrate through the oxide layer 110 and the gate electrode 120 that are alternately laminated on the substrate 100.

The outer layer 140 may include, for example, a semiconductor material such as monocrystalline silicon. The outer layer 140 may operate as a channel region, for example, in the three-dimensional non-volatile memory device. For example, the outer layer 140 may provide a charge which is trapped or emitted by the insulating pattern 150.

An insulating pattern 150 may be formed on the substrate 100 between the oxide layer 110 and the gate electrode 120 and between the gate electrode 120 and the channel patterns 130 and 140. In the drawing, the insulating pattern 150 is illustrated as being formed in a zigzag shape between the oxide layer 110 and the gate electrode 120, but inventive concepts are not limited thereto.

For example, the insulating pattern 150 may be formed between the channel patterns 130 and 140 and the oxide layer 110, and between the channel pattern 130 and 140 and the gate electrode 120. In this case, the oxide layer 110 and the gate electrode 120 may be in direct contact with each other in the z-direction. In this case, the insulating pattern 150 may be formed conformally along the side wall of a channel hole (CHH in FIG. 14) inside the channel hole (CHH in FIG. 14) to be described later. At this time, the outer layer 140 may be formed between the inner layer 130 and the insulating pattern 150.

The insulating pattern 150 may include a blocking layer, a charge trap layer and a tunneling insulation layer. Details description thereof will be provided later with reference to FIG. 20.

A drain 210 is formed on the channel patterns 130 and 140 and may be electrically connected to the bit line 220. In the drawings, the drain 210 and the bit line 220 are illustrated as being in direct contact with each other, but inventive concepts are not limited thereto. For example, the drain 210 may be electrically connected to the bit line 220 via a contact plug.

The channel patterns 130 and 140 and the gate electrode(s) 120 adjacent thereto may form a memory string. The memory string may include, for example, a plurality of transistor structures. The memory string may be formed, for example, to be perpendicular to (e.g., in the z-direction) to the substrate 100. The memory string may be included in the three-dimensional memory array, and there may be a plurality of memory strings.

Hereinafter, referring to FIGS. 3 to 11, the deposition apparatus according to some example embodiments of inventive concepts and a method of fabricating a non-volatile memory device using the deposition apparatus will be described. For the sake of clarity of explanation, features already described will not be repeated.

Figure 3:
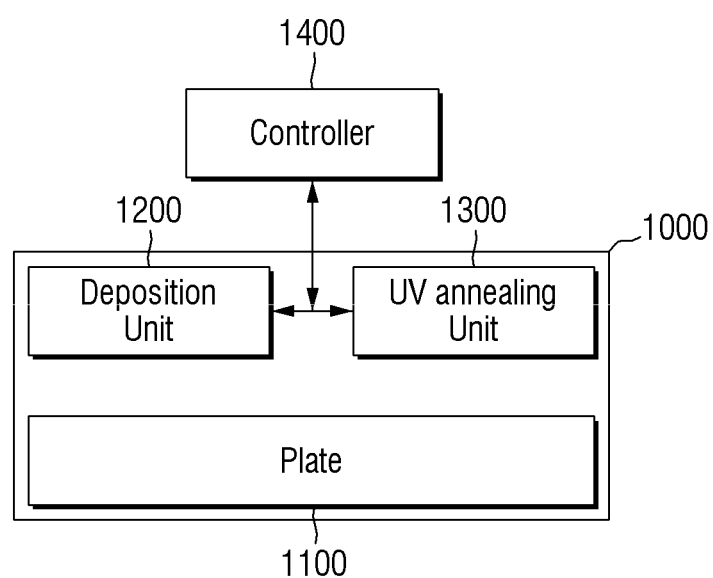
FIG. 3 is a conceptual block diagram for explaining a deposition apparatus according to some example embodiments of inventive concepts.
Figure 4A:
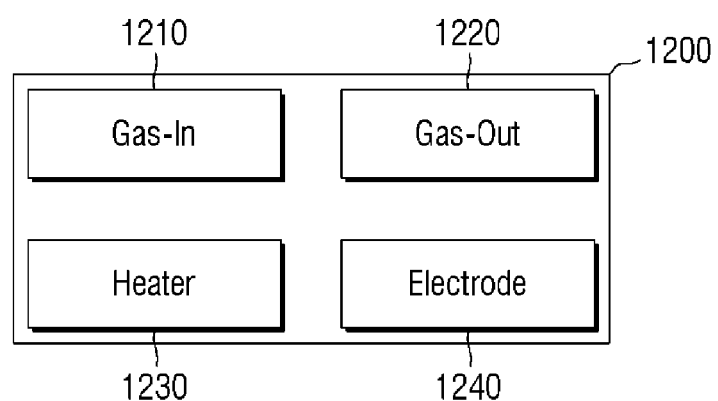
FIG. 4a is a conceptual block diagram of a deposition unit of FIG. 3.
Figure 4B:
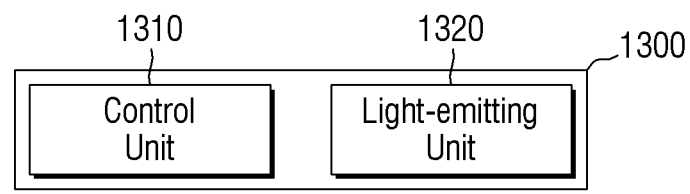
FIG. 4b is a conceptual block diagram of a UV annealing unit of FIG. 3.
Figure 5:
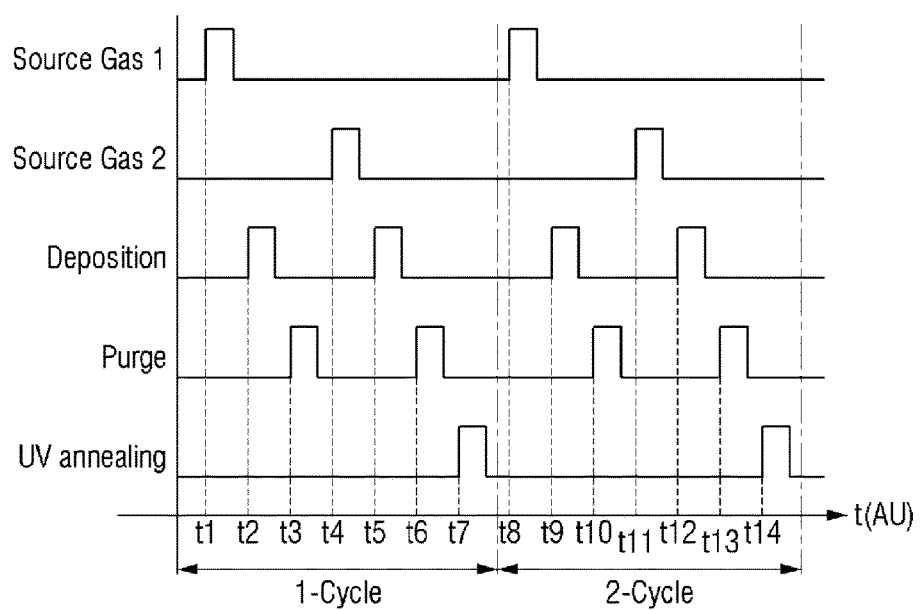
FIG. 5 is a timing chart for explaining the operation of the deposition apparatus according to some example embodiments of inventive concepts and the fabricating process of the non-volatile memory device using the deposition apparatus.
Figure 6:
FIGS. 6 to 11 are intermediate stage diagrams for explaining a fabricating process of a non-volatile memory device according to some example embodiments of inventive concepts.

FIG. 3 is a conceptual block diagram for explaining the deposition apparatus according to some example embodiments of inventive concepts. FIG. 4a is a conceptual block diagram of the deposition unit of FIG. 3. FIG. 4b is a conceptual block diagram of the UV annealing unit of FIG. 3. FIG. 5 is a timing chart for explaining the operation of the deposition apparatus according to some example embodiments of inventive concepts and the fabricating process of the non-volatile memory device using the deposition apparatus. FIGS. 6 to 11 are cross-sectional views taken along a line A-A' of FIG. 2 which are intermediate stage diagrams for explaining a fabricating process of the non-volatile memory device according to some example embodiments of inventive concepts.

Referring to FIGS. 3 to 11, the deposition apparatus according to some example embodiments of inventive concepts includes a chamber 1000, a deposition unit 1200, an ultraviolet ray (UV) annealing unit 1300, a plate 1100, a controller 1400, and the like. However, inventive concepts are not limited to this, and may, of course, further include additional constituent elements as necessary.

The deposition unit 1200, the UV annealing unit 1300 and the plate 1100 may be disposed in a single chamber 1000. The controller 1400 may include memory (not shown) and a central processing unit (CPU), or other suitable hardware controller, that when, executing instructions stored in the memory, configures the controller 1400 as a special purpose computer to perform the operations of the deposition apparatus described later with reference to FIGS. 5 and 12-13. The controller 1400 may controller the deposition unit 1200 and the UV annealing unit 1300, as well associated functions of the deposition apparatus such as loading the substrate on the plate 1100 and unloading the substrate from the plate 1100. The controller 1400 may improve the functioning of the apparatus by controlling the UV annealing unit 1300 to perform at least one UV annealing process on oxide layers deposited by the apparatus. Since the annealing process is performed on the oxide layers, the oxide layers may be more rigid even if the thickness is relatively thin.

The plate 1100 may be disposed in the chamber 1000 to support the substrate 100 provided during the fabricating process of the non-volatile memory device.

The deposition unit 1200 may perform the deposition process during the fabricating processes of the non-volatile memory device. The deposition process may be, for example, a process of alternately and sequentially depositing a plurality of sacrificial layers 121, a plurality of oxide layers 110 and the like on the substrate 100. For example, the deposition unit 1200 may include at least one inlet 1210, at least one outlet 1220, at least one heater 1230, and at least one electrode 1240 and the like. However, inventive concepts are not limited thereto. For example, the deposition unit 1200 may, of course, be made up of various constituent elements, for example, depending on the type of deposition processes (e.g., chemical vapor deposition (CVD), atomic layer deposition (ALD) and the like).

The inlet 1210 allows the reactive gas to flow into the chamber 1000 from the outside. The heater 1230 may heat the substrate 100, and the heater 1230 may be attached to the plate 1100 as necessary. The electrode 1240 may convert the reactive gas flowing from the inlet 1210, for example, into a plasma state. The outlet 1220 may discharge the reactive gas (and/or gas products) to the outside of the chamber 1000.

The UV annealing unit 1300 may perform an UV annealing process on the oxide layers 110 deposited on the substrate 100. The UV annealing unit 1300 may include a control unit 1310 and light-emitting unit 1320. The control unit 1310 may control the light-emitting unit 1320 to perform UV annealing process on the oxide layer 110 deposited on the substrate 100. The light-emitting unit 1320 may include one or more lasers (e.g., excimer lasers) and/or light-emitting devices for generating UV light and directing the UV light towards the substrate.

In some example embodiments, the deposition apparatus is configured to perform the deposition process and the UV annealing process in situ in a single chamber 1000.

The deposition unit 1200 may cause the first reactive gas (source gas 1) to flow into the chamber 1000 at a first time t1. The first reactive gas (source gas 1), for example, may be nitrogen gas. At a second time t2, the deposition unit 1200 may deposit a sacrificial layer 121 on the substrate 100 supported by the plate 1100 inside the chamber 1000 in situ, using the first reactive gas (source gas 1). The sacrificial layer 121 may include, for example, silicon nitride.

In some example embodiments, when the deposition process is performed with plasma-enhanced chemical deposition (PECVD), the deposition unit 1200 may deposit the sacrificial layer 121 on the substrate 100, by putting the first reactive gas (source gas 1) into a plasma state.

The purge gas, for example, may be discharged after flowing in at a third time t3.

The deposition unit 1200 may cause the second reactive gas (source gas 2) to flow into the chamber 1000 at a fourth time t4. The second reactive gas (source gas 2) may be, for example, oxygen gas. At a fifth time t5, the deposition unit 1200 may deposit the oxide layer 110 on the substrate 100 with the sacrificial layer 121 deposited thereon inside the chamber 1000 in situ, by utilizing the second reactive gas (source gas 2). The oxide layer 110 may include, for example, silicon oxide. In some example embodiments, as it has been previously described, the oxide layer 110 may include, for example, silicon oxide and a low dielectric material.

In some example embodiments, when the deposition process is performed with plasma-enhanced chemical deposition (PECVD), the deposition unit 1200 may deposit the oxide layer 110 on the substrate 100, by putting the second reactive gas (source gas 2) into a plasma state.

The purge gas may be discharged, for example, after flowing in at a sixth time t6.

Figure 7:
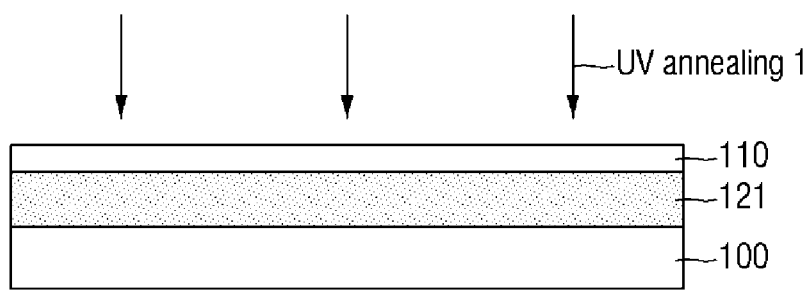

As illustrated in FIG. 7, the UV annealing unit 1300 may perform the first UV annealing process (UV annealing 1) on the substrate 100 in which the sacrificial layer 121 and the oxide layer 110 are alternately laminated, at the seventh time t7. Specifically, the UV annealing unit 1300 may perform the first UV annealing process (UV annealing 1) on the oxide layer 110 inside the chamber 1000 in situ.

The deposition process and the UV annealing process from the first time t1 to the seventh time t7 may constitute a first cycle (1-Cycle).

Figure 8:
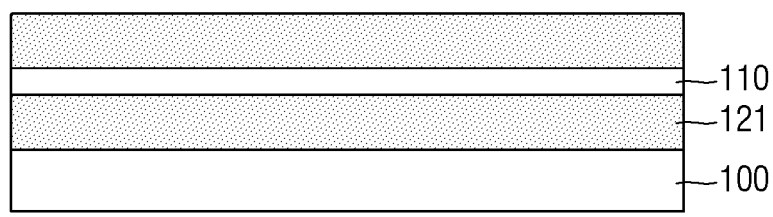

After the first cycle (1-Cycle) is executed inside the chamber 1000, the second cycle (2-Cycle) may be performed on the substrate 100 subjected to the first cycle (1-Cycle) inside the chamber 1000. That is to say, the deposition process of the sacrificial layer 121 at the ninth time t9 may be performed on the oxide layer 110 deposited in the first cycle (1-Cycle). That is, as illustrated in FIG. 8, the sacrificial layer (the sacrificial layer on the uppermost level in FIG. 8) to be deposited at the ninth time t9 may be deposited directly on the oxide layer 110 which is deposited at the fifth round t5 and is subjected to the first UV annealing process (UV annealing 1).

Figure 9:
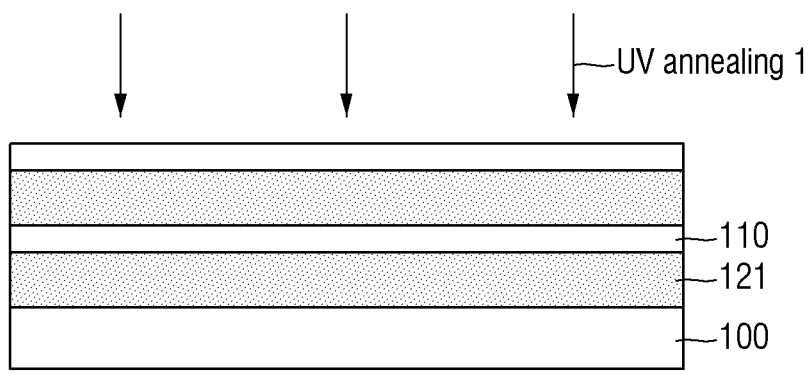
Figure 10:
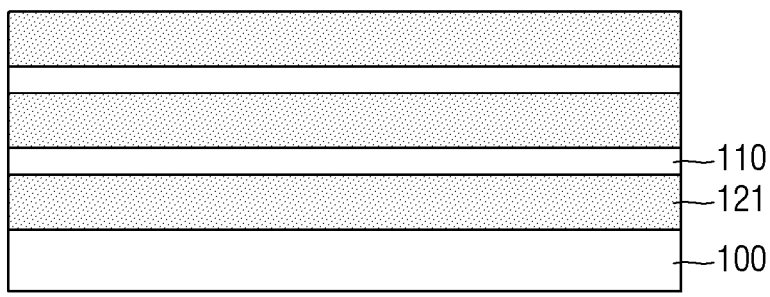

As illustrated in FIG. 9, the second UV annealing process (UV annealing 2) may be performed on the substrate 100 in which a plurality of sacrificial layers 121 and a plurality of oxide layers 110 are alternately laminated, at a fourteenth time t14. Specifically, the second UV annealing process (UV annealing 2) may be performed on the oxide layer 110 laminated at a twelfth timet 12.

In some example embodiments, the first cycle (1-Cycle) and the second cycle (2-Cycle) may be substantially identical to each other. For example, the wavelength or intensity of the first UV annealing process UV (UV annealing 1) at the seventh time t7 may be substantially identical to the wavelength or intensity of the second UV annealing process (UV annealing 2) at the fourteenth time t14. In other words, the first cycle (1-Cycle) may be repeatedly executed.

As a result of repeatedly executing the first cycle (1-Cycle), a mold layer (FIG. 11) in which a plurality of sacrificial layers 121 and a plurality of oxide layers 110 are alternately laminated on the substrate 100 may be formed. At this time, since the UV annealing process is executed by the UV annealing unit 1300 in each cycle (e.g., each of the repeated first cycles (1-Cycle)), the UV annealing process may be performed on all of the plurality of oxide layers 110 laminated on the substrate 100.

In some example embodiments, the first cycle (1-Cycle) and the second cycle (2-Cycle) may be substantially identical to each other. However, as the cycle (e.g., the first cycle (1-Cycle)) is repeated, the UV wavelength or intensity of the UV annealing process at each cycle may increase, decrease, decrease again at a certain time after increasing, or may increase again at a certain time after decreasing.

Figure 11:
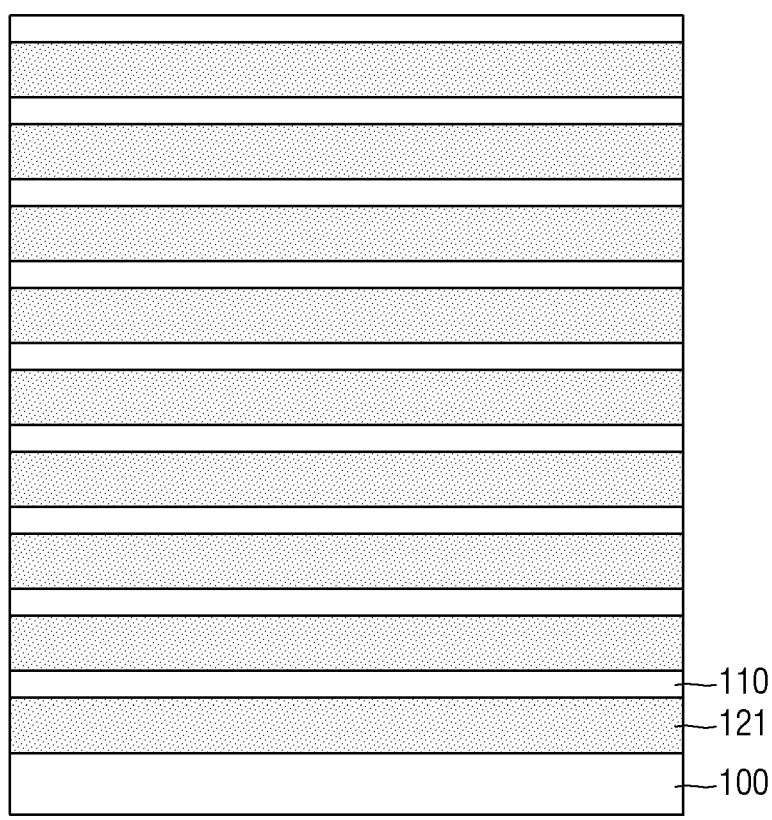

Specifically, as illustrated in FIG. 11, in order to form a mold layer in which a plurality of sacrificial layers 121 and a plurality of oxide layers 110 are alternately laminated on the substrate 100, the first cycle (1-Cycle) may be repeatedly executed. However, in the case where the first cycle (1-Cycle) is executed for the second time (2-Cycle in FIG. 5), the wavelength or intensity of the UV annealing process (e.g., the first annealing process UV (UV annealing 1) at the seventh time t7) may be different from the wavelength or intensity of the UV annealing process (e.g., the second annealing process (UV annealing 2) at the fourteenth time t14) at the time of second execution.

For example, when the UV wavelength or intensity of the UV annealing process increases with repetition of the cycle, the wavelength and intensity of UV in the second UV annealing process (UV annealing 2) may be greater than the wavelength and intensity of UV in the first UV annealing process (UV annealing 1). Also, the UV wavelength or intensity of the third UV annealing process in the third cycle performed on the substrate 100 subjected to the second cycle (2-Cycle) may be greater than the UV wavelength or intensity in the second UV annealing process (UV annealing 2).

For example, when the UV wavelength or intensity of the UV annealing process decreases as the cycle is repeated, the wavelength or intensity of UV in the first UV annealing process UV (UV annealing 1) may be greater than the wavelength or intensity of UV in the second UV annealing process (UV annealing 2). Also, the UV wavelength or intensity of the third UV annealing process in the third cycle performed on the substrate 100 subjected to the second cycle (2-Cycle) may be smaller than the UV wavelength or intensity in the second UV annealing process (UV annealing 2).

For example, when the UV wavelength or intensity of the UV annealing process increases and then decreases again at a certain time with repetition of the cycle, the certain time may be a time at which the cycle is repeatedly performed for n-times (where n is a natural number).

For example, when the UV wavelength or intensity of the UV annealing process decreases and then increases again at a certain time with repetition of the cycle, the certain time may be a time at which the cycle is repeatedly performed for m-times (where m is a natural number).

Even if the UV wavelength or intensity of the UV annealing process in each cycle changes with repetition of the cycle, because the UV annealing unit 1300 performs the UV annealing process on the oxide layer 110 for each cycle, all the oxide layers 110 of FIG. 11 may be subjected to the UV annealing process.

The thickness of the plurality of oxide layers 110 of FIG. 11, for example, may be smaller than the thickness of the plurality of sacrificial layers 121. Here, the thickness may be a value measured in a direction perpendicular to the substrate 100, that is, in a thickness direction. However, inventive concepts are not limited thereto. For example, the thickness of the plurality of oxide layers 110 may, of course, be substantially equal to or larger than the thickness of the plurality of sacrificial layers 121.

A deposition apparatus according to according to some example embodiments of inventive concepts may be a deposition apparatus for fabricating a non-volatile memory, particularly a three-dimensional non-volatile memory, and may include a UV annealing unit that is capable of performing UV annealing. A method of fabricating a non-volatile memory device using the deposition apparatus may include performing the UV annealing process on all of the plurality of oxide layers 110, when alternately laminating the plurality of sacrificial layers 121 and the plurality of oxide layers 110 on the substrate 100.

The deposition apparatus according to some example embodiments of inventive concepts and the method of fabricating a non-volatile memory device using the same may reform the oxide layer, by performing the UV annealing process on the oxide layer 110 when alternately laminating the sacrificial layer 121 and the oxide layer 110 on the substrate 100. This may improve leakage current characteristics and RC delay characteristics. In addition, compared with a case where another type of annealing process is performed on the oxide layer, the thickness of the oxide layer 110 may be greatly reduced when the UV annealing process is executed. Furthermore, when performing the UV annealing process of the oxide layer 110, outgassing of impurities that may be included during deposition may be smoothly performed during the deposition process.

Hereinafter, a deposition apparatus according to some example embodiments of inventive concepts and a method of fabricating a non-volatile memory device using the deposition apparatus will be described with reference to FIGS. 5 and 6 to 12. For the sake of clarity of explanation, features already described will not be repeated.

Figure 12:
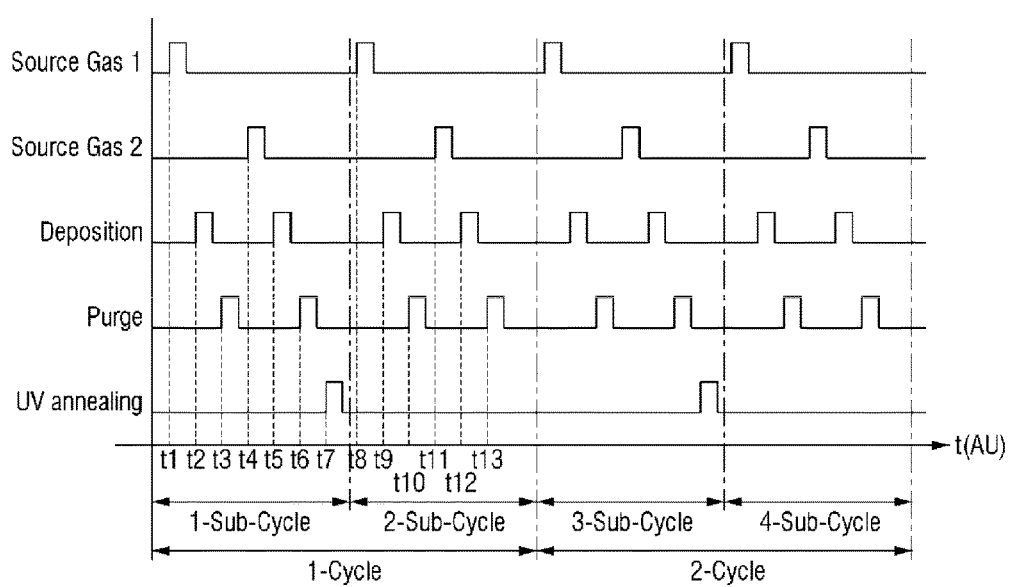
FIGS. 12 and 13 are timing charts for explaining the operation of the deposition apparatus according to some example embodiments of inventive concepts and the fabricating process of the non-volatile memory device using the deposition apparatus.

FIG. 12 is a timing chart for explaining the operation of the deposition apparatus according to some example embodiments of inventive concepts and the fabricating process of the non-volatile memory device using the deposition apparatus.

Referring to FIGS. 5 and 6 to 12, the first cycle (1-Cycle) may include a first sub-cycle (1-Sub-Cycle) and a second sub-cycle (2-Sub-Cycle).

The first sub-cycle (1-Sub-Cycle) may be substantially identical to the first cycle (1-Cycle) of FIG. 5. The second sub-cycle (2-Sub-Cycle) may not include the UV annealing process, unlike the first sub-cycle (1-Sub-Cycle).

Specifically, after the sacrificial layer 121 is deposited at the ninth time t9 on the oxide layer 110 on which the UV annealing process is performed at the seventh time t7, the oxide layer 110 may be further deposited at the twelfth time t12. At this time, the UV annealing process may not be executed, after the oxide layer is deposited at the twelfth t12 of the second sub-cycle (2-Sub-Cycle). Thereafter, the sacrificial layer 121 may be deposited again in the third sub cycle.

In some example embodiments, the second cycle (2-Cycle) may be substantially identical to the first cycle (1-Cycle). Therefore, in order to form the mold layer of FIG. 11, the first cycle (1-Cycle) may be repeatedly executed. At this time, the wavelength and intensity of UV of the UV annealing process in each cycle may be substantially the same.

In some example embodiments, the second cycle (2-Cycle) may be substantially identical to the first cycle (1-Cycle). However, as the cycle (e.g., the first cycle (1-Cycle)) is repeated, the UV wavelength or intensity of the UV annealing process at each cycle may increase, decrease, or decrease again at a certain time after increasing, or may increase again at a certain time after decreasing. Since the description thereof have been provided above, it will not be described again.

Hereinafter, with reference to FIGS. 5, 6 to 11 and 13, the deposition apparatus according to some example embodiments of inventive concepts and the method of fabricating the non-volatile memory device using the deposition apparatus will be described. For the sake of clarity of explanation, the repeated contents will not be described.

Figure 13:
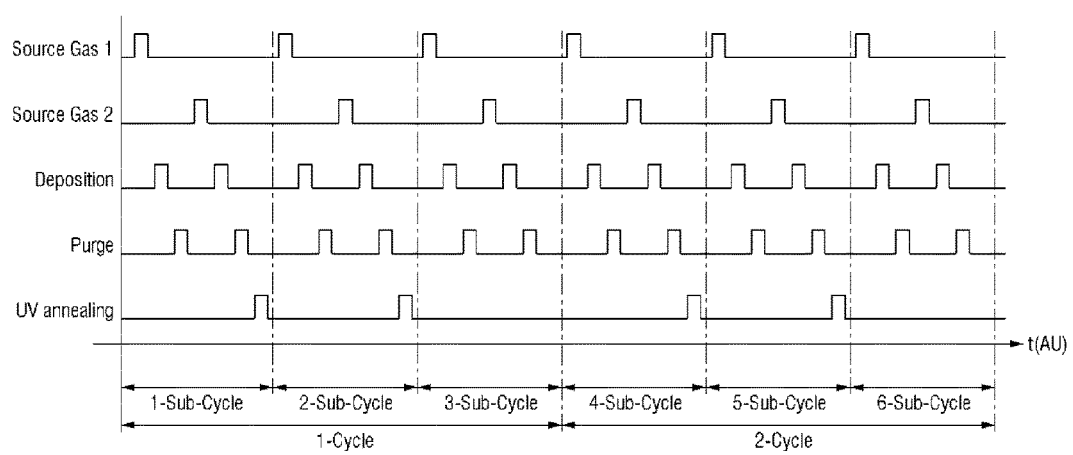

FIG. 13 is a timing chart for explaining the operation of the deposition apparatus according to some example embodiments of inventive concepts and the fabricating process of the non-volatile memory device using the deposition apparatus.

Referring to FIGS. 5, 6 to 11 and 13, the first cycle (1-Cycle) includes a first sub-cycle (1-Sub-Cycle), a second sub-cycle (2-Sub-Cycle) and a third sub-cycle (3-Sub-Cycle).

The first sub-cycle (1-Sub-Cycle) and the second sub-cycle (2-Sub-Cycle) may be substantially identical to the first cycle (1-Cycle) of FIG. 5. The third sub-cycle (3-Sub-Cycle) may not include the UV annealing process, unlike the first and second sub cycles (1-Sub-Cycle and 2-Sub-Cycle).

Specifically, each of the three sacrificial layers 121 and the three oxide layers 110 may be alternately deposited on the substrate 100 in one cycle (e.g., the first cycle (1-Cycle)). At this time, after the first and second oxide layers 110 are laminated in one cycle (e.g., the first cycle (1-Cycle)), the UV annealing process is performed. However, after the third oxide layer 110 is laminated, the UV annealing process may not be performed. Thereafter, a fourth sub cycle (4-Sub-Cycle) of the second cycle (2-Cycle) may be continued.

In some example embodiments, the second cycle (2-Cycle) may be substantially identical to the first cycle (1-Cycle). Therefore, in order to form the mold layer of FIG. 11, the first cycle (1-Cycle) may be repeatedly executed. In this case, the UV annealing process may be performed twice in one cycle. At this time, the wavelength and intensity of UV in the UV annealing process in each cycle may be substantially the same. Furthermore, the UV wavelength or intensity of the UV annealing process in each sub-cycle may be substantially the same.

In some example embodiments, the second cycle (2-Cycle) may be substantially identical to the first cycle (1-Cycle). However, as the cycle (e.g., the first cycle (1-Cycle)) is repeated, the UV wavelength or intensity of the UV annealing process at each cycle may increase, decrease, decreases again at a certain time after increasing or may increase again at a certain time point after decreasing. Furthermore, the UV wavelength or the intensity of the UV annealing process at each sub-cycle may increase, decrease, decrease again at a certain time after decreasing, or may increase again at a certain time after decreasing. Since the description thereof have been provided above, the description thereof will not be provided again.

A method of fabricating a non-volatile memory device according to some example embodiments of inventive concepts will be described below with reference to FIGS. 2, 11, and 14 to 20. For clarity of explanation, features already described will not be repeated.

FIGS. 14 to 19 are intermediate stage diagrams for explaining a method of fabricating a non-volatile memory device according to some example embodiments of inventive concepts. FIG. 20 is an enlarged view of a TS region of FIG. 19. FIGS. 14 to 19 may be cross-sectional views taken along the line A-A' of FIG. 2.

Figure 14:
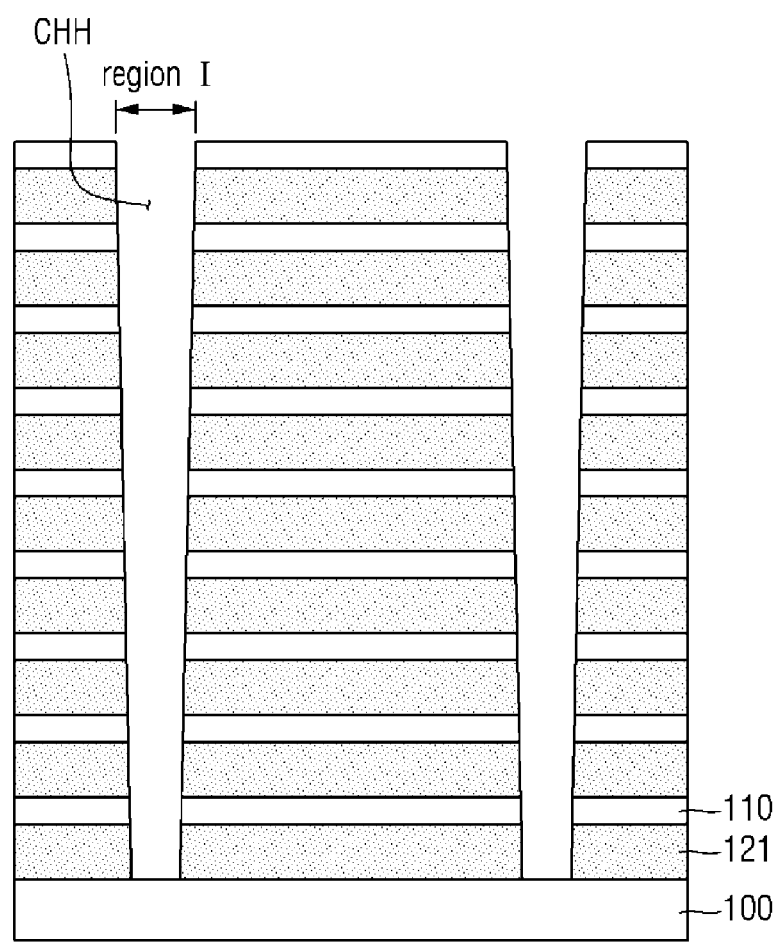
FIGS. 14 to 19 are intermediate stage diagrams for explaining a method of fabricating a non-volatile memory device according to some example embodiments of inventive concepts.

Referring to FIGS. 11 and 14, a channel hole CHH may be formed in a plurality of sacrificial layers 121 and a plurality of oxide layers 110 that are alternately laminated on the substrate 100. For example, the channel hole CHH may be formed by etching the first region I of the plurality of oxide layers 110 and a first region area I of the plurality of sacrificial layers 121. The first region I of the plurality of oxide layers 110 and the first region I of the plurality of sacrificial layers 121 may be regions of the same position. For example, a plurality of channel holes CHH may be formed to be spaced apart from each other. The channel hole CHH may expose the substrate 100.

Although the drawings illustrate that the side wall of the channel hole CHH has an arbitrary inclination with respect to the substrate 100, inventive concepts are not limited thereto. For example, the side wall of the channel hole CHH may, of course, have another inclination other than that illustrated in the drawing according to the etching profile.

Figure 15:
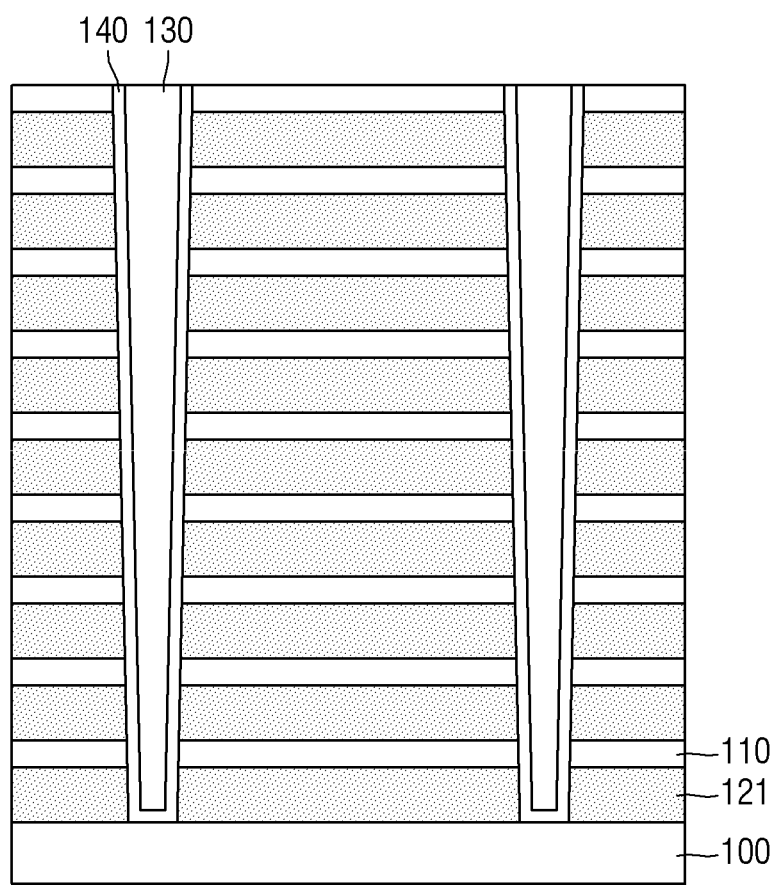

Referring to FIG. 15, channel patterns 130 and 140 may be formed in the channel hole CHH. The outer layer 140 may be conformally formed in the channel hole CHH along the profile of the channel hole CHH. The inner layer 130 may be formed by filling the portion of the channel hole CHH which remains after forming the outer layer 140.

Figure 16:
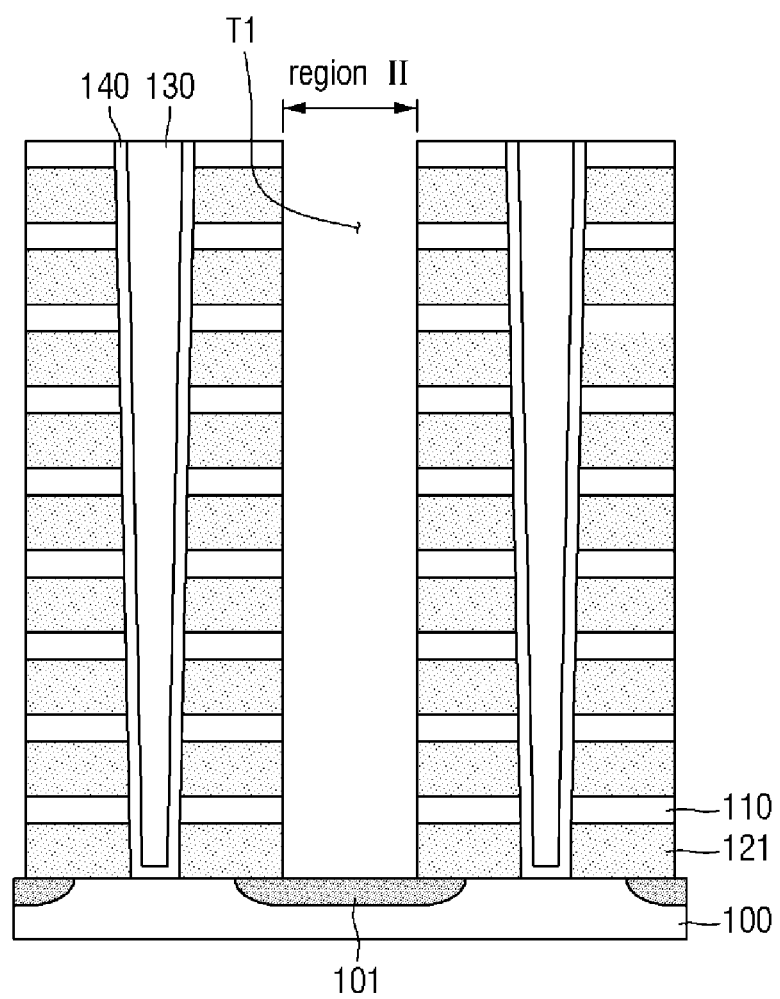

Referring to FIG. 16, a trench T1 may be formed in a plurality of sacrificial layers 121 and a plurality of oxide layers 110 that are alternately laminated on the substrate 100. For example, the trench T1 may be formed by etching a second region (region II) of the plurality of oxide layers 110 and a second region (region II) of the plurality of sacrificial layers 121. The second region (region II) of the plurality of oxide layers 110 and the second region (region II) of the plurality of sacrificial layers 121 may be regions of the same position. The trench T1 may be formed to be spaced apart from the channel patterns 130 and 140. The trench T1 may expose the substrate 100.

A common source region 101 may be formed in the portion of the substrate 100 exposed by the trench T1. The common source region 101 may be formed, for example, using a doping process. The common source region 101 may be formed in the substrate 100.

Figure 17:
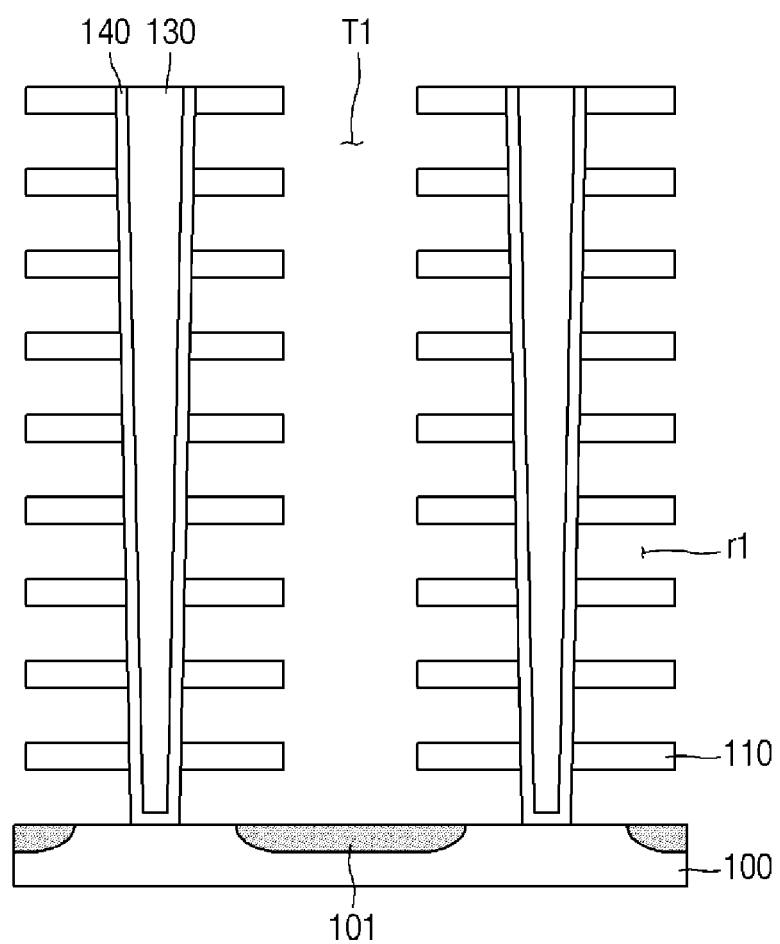

Referring to FIG. 17, a recess r1 may be formed by removing the sacrificial layer 121 exposed by the trench T1. The recess r1 may expose some of the outer layer 140 in some example embodiments. The recess r1 may be formed by selectively removing the sacrificial layer 121. The recess r1 may be formed, for example, through an etching process that uses etchant with a high etching selection ratio of the sacrificial layer 121 to the oxide layer 110.

According to the deposition apparatus according to some example embodiments of inventive concepts and the method of fabricating the non-volatile memory device using the deposition apparatus, since the UV annealing process is performed on the oxide layer 110, the oxide layer 110 is rigid even if the thickness is relatively thin, and the oxide layer 110 may maintain its shape even if the sacrificial layer 121 is removed.

Figure 18:
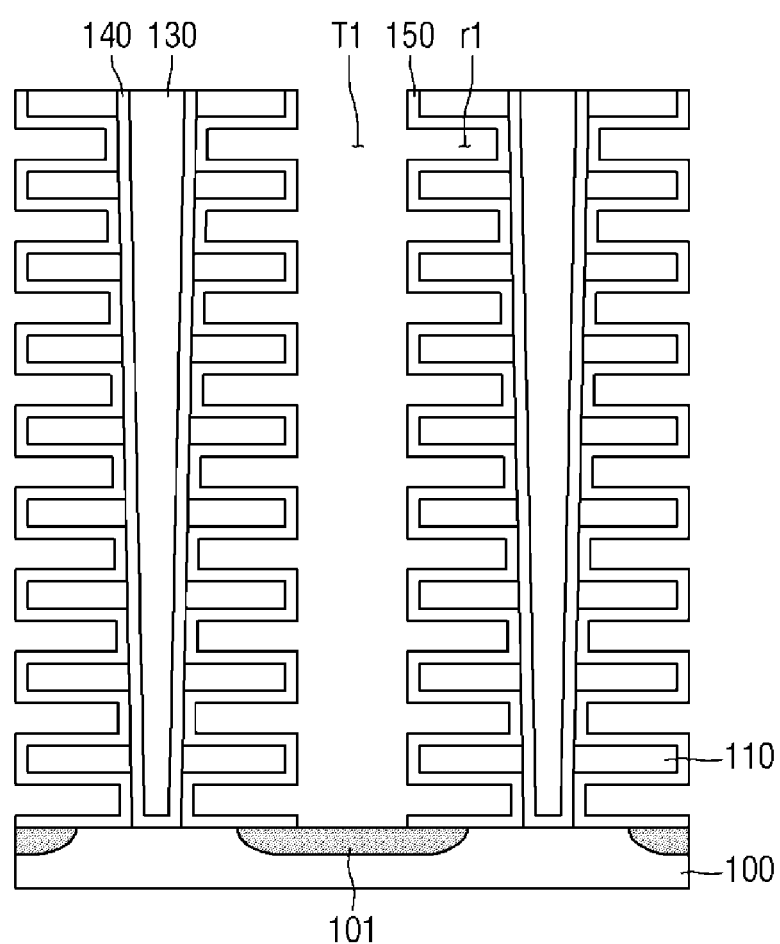

Referring to FIG. 18, an insulating pattern 150 which fills some of the recess r1 may be formed. The insulating pattern 150 may be formed along the periphery of the oxide layer 110 which remains after forming some of the upper surface of the substrate 100 and the recess r1. Also, the insulating pattern 150 may be conformally formed along the profile of the recess r1.

Figure 19:
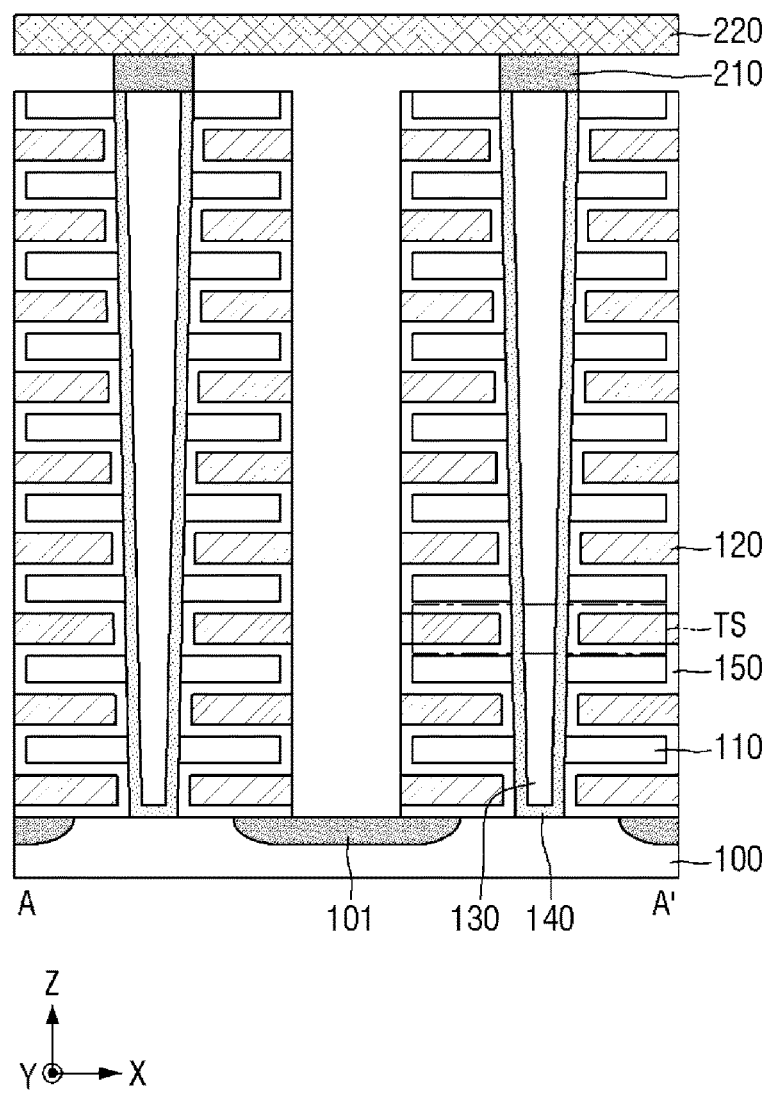
Figure 20:
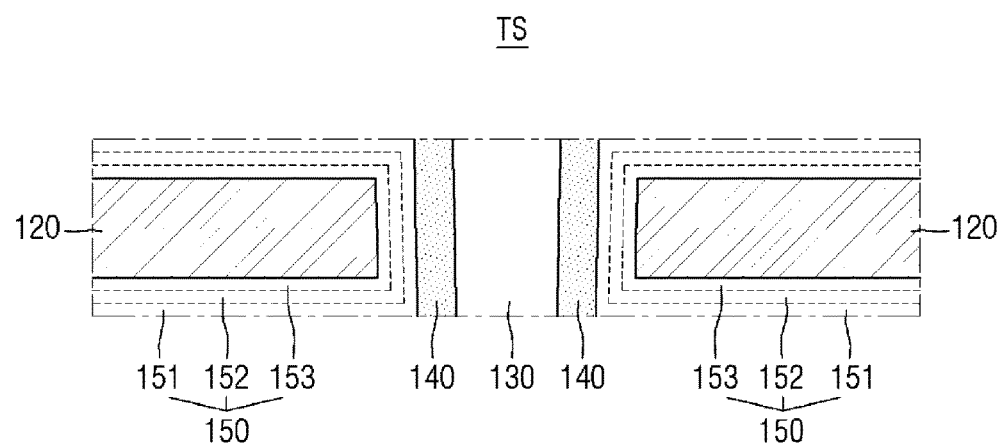
FIG. 20 is an enlarged view of a TS region of FIG. 19.

Referring to FIG. 19, a gate electrode 120, a drain 210 and a bit line 220 may be formed. The gate electrode 120 may be formed to fill the remaining parts of the recess r1 which remains after forming the insulating pattern 150. The drain 210 may be formed on the channel patterns 130 and 140. The bit line 220 may be formed on the drain 210 to extend along the x-direction.

In FIG. 19, the thickness of the gate electrode 120 in the thickness direction and the thickness of the oxide layer 110 in the thickness direction are illustrated to be substantially identical to each other, but inventive concepts are not limited thereto. For example, the thickness of the gate electrode 120 in the thickness direction may be different from the thickness of the oxide layer 110 in the thickness direction.

Referring to FIG. 20, the insulating pattern 150 may include a plurality of layers. For example, the insulating pattern 150 may include a tunneling insulating layer 151, a charge trap layer 152, and a blocking insulating layer 153.

The tunneling insulating layer 151 may be a part through which electric charge passes between the outer layer 140 and the charge trap layer 152. The tunneling insulating layer 151 may be, for example, a silicon oxide layer or a silicon nitride layer, or may be formed as a double layer of a silicon oxide layer and a silicon nitride layer.

The charge trap layer 152 may be disposed between the blocking insulating layer 153 and the tunneling insulation layer 151. The charge trap layer 152 may be a part in which charges having passed through the tunneling insulating layer 151 are stored.

The charge trap layer 152 may be formed of, for example, a nitride layer or a high dielectric constant (high-k) layer. The nitride layer may include, for example, one or more of silicon nitride, silicon oxynitride, hafnium oxynitride, zirconium oxynitride, hafnium silicon oxynitride or hafnium aluminum oxynitride. The high dielectric constant layer may include, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The blocking insulating layer 153 may limit and/or prevent the charge captured by the charge trap layer 152 from being emitted to the gate electrode 120. Further, the blocking insulating layer 153 may limit and/or prevent the charge of the gate electrode 120 from being captured by the charge trap layer 152.

The blocking insulating layer 153 may include silicon oxide or an insulating metal oxide having a dielectric constant greater than that of silicon oxide. For example, the blocking insulating layer 153 may be formed of high dielectric constant materials such as aluminum oxide, hafnium oxide, lanthanum oxide, tantalum oxide, titanium oxide, lanthanum hafnium oxide, lanthanum aluminum oxide or dysprosium scandium oxide, or a complex level laminated by a combination thereof.

In the drawings, the insulating pattern 150 is illustrated as being formed in a zigzag shape, but inventive concepts are not limited thereto. In some example embodiments, all of the tunneling insulating layer 151, the charge trap layer 152 and the blocking insulating layer 153 are formed among the oxide layer 110, the gate electrode 120 and the outer layer 140. In this case, all of the tunneling insulation film 151, the charge trap layer 152 and the blocking insulating layer 153 may be formed in the channel hole CHH along the side wall of the channel hole CHH. Thereafter, the outer layer 140 may be formed in the channel hole CHH in which the tunneling insulation film 151, the charge trap layer 152 and the blocking insulating layer 153 are formed. At this time, the outer layer 140 may fill some of the remaining channel hole CHH. The space of the channel hole CHH which remains after forming the outer layer 140 may be filled with the inner layer 130.

In some example embodiments, some of the tunneling insulating layer 151, the charge trap layer 152, and the blocking insulating layer 153 are formed in a zigzag shape between the gate electrode 120 and the oxide layer 110, and between the gate electrode 120 and the channel patterns 130 and 140, and the remaining part thereof may be formed along the side wall of the channel hole CHH in the channel hole CHH.

In any case, the charge trap layer 152 may be formed to be adjacent to the channel patterns 130 and 140.

While some example embodiments of inventive concepts have been particularly illustrated and described, it will be understood by those of ordinary skill in the art that various changes in form and detail may be made therein without departing from the spirit and scope of inventive concepts as defined by the following claims. Thus, example embodiments described herein should be considered in a descriptive sense only and not for purposes of limitation.

What is claimed is:

1. A deposition apparatus comprising:
a chamber;
a plate in the chamber, the plate being configured to support a substrate;
a deposition unit configured to perform a deposition process that includes sequentially depositing a first sacrificial layer, a first oxide layer, a second sacrificial layer and a second oxide layer on the substrate; and
a UV annealing unit configured to perform a first ultraviolet ray (UV) annealing process on the first oxide layer after the first oxide layer is deposited, and to perform a second UV annealing process different from the first UV annealing process on the second oxide layer after the second oxide layer is deposited, the UV annealing unit being configured to perform the first and second UV annealing processes being performed in-situ in the chamber.

2. The deposition apparatus of claim 1, wherein
the deposition unit is configured to perform the deposition process to further include: sequentially depositing a third sacrificial layer and a third oxide layer on the first oxide layer, after depositing the first oxide layer and before depositing the second sacrificial layer; and
sequentially depositing a fourth sacrificial layer and a fourth oxide layer on the second oxide layer after depositing the second oxide layer.

3. The deposition apparatus of claim 2, wherein
the UV annealing unit is configured to perform a third UV annealing process on the third oxide layer after the third oxide layer is deposited,
the UV annealing unit is configured to perform a fourth UV annealing process on the fourth oxide layer after the fourth oxide layer is deposited, and
the UV annealing unit is configured to perform the third and fourth UV annealing processes in situ in the chamber.

4. The deposition apparatus of claim 3, wherein UV wavelengths of each of the first to fourth UV annealing processes are different from one another.

5. The deposition apparatus of claim 3, wherein UV intensities of each of the first to fourth UV annealing processes are different from one another.

6. The deposition apparatus of claim 1, wherein
the deposition unit is configured to perform the deposition process to further include sequentially depositing a third sacrificial layer, a third oxide layer, a fourth sacrificial layer, a fourth oxide layer, a fifth sacrificial layer, a fifth oxide layer, a sixth sacrificial layer and a sixth oxide layer on the second oxide layer, after the depositing the second oxide layer,
the UV annealing unit is configured to perform a third UV annealing process on the fourth oxide layer after the fourth oxide layer is deposited,
the UV annealing unit is configured to perform a fourth UV annealing process on the fifth oxide layer after the fifth oxide layer is deposited, and
the UV annealing unit is configured to perform the third and fourth UV annealing processes in situ in the chamber.

7. The deposition apparatus of claim 6, wherein UV wavelengths of each of the first to fourth UV annealing processes are different from one another.

8. The deposition apparatus of claim 6, wherein UV intensities of each of the first to fourth UV annealing processes are different from one another.

9. The deposition apparatus of claim 1, wherein a wavelength of UV of the first UV annealing process is different from a wavelength of UV of the second UV annealing process.

10. The deposition apparatus of claim 1, wherein an intensity of UV of the first UV annealing process is different from an intensity of UV of the second UV annealing process.

11. The deposition apparatus of claim 1, wherein the first and second oxide layers comprise a silicon oxide and a material having a dielectric constant lower than a dielectric constant of silicon oxide.

12. The deposition apparatus of claim 1, wherein the deposition unit is configured to perform the deposition process so thicknesses of each of the first and second sacrificial layers in a thickness direction are greater than thicknesses of each of the first and second oxide layers in the thickness direction.

13. A method of fabricating a non-volatile memory device, the method comprising:
forming a first sacrificial layer on a substrate;
forming a first oxide layer on the first sacrificial layer;
performing a first UV annealing on the first oxide layer;
forming a second sacrificial layer on the first oxide layer;
forming a second oxide layer on the second sacrificial layer;
performing a second UV annealing different from the first UV annealing on the second oxide layer;

forming a channel hole that exposes the substrate by etching a first region of the first and second oxide layers and a first region of the first and second sacrificial layers;

forming a channel pattern in the channel hole;

forming a charge trap layer on the substrate adjacent to the channel pattern;

forming a trench by etching a second region of the first and second oxide layers and a second region of the first and second sacrificial layers, the trench being spaced apart from the channel pattern to expose the substrate; and forming a gate electrode by removing the first and second sacrificial layers exposed by the trench.

14. The method according to claim 13, wherein the forming the first and second sacrificial layers, the forming the first and second oxide layers, and the performing the first and second UV annealing are performed in-situ in a single chamber.

15. The method according to claim 13, further comprising:

forming a third sacrificial layer on the first oxide layer after the performing the first UV annealing and before the forming the second sacrificial layer;

forming a third oxide layer on the third sacrificial layer;

forming a fourth sacrificial layer on the second oxide layer after performing the second UV annealing; and forming a fourth oxide layer on the fourth sacrificial layer.

16. A deposition apparatus comprising:

a chamber;

a plate in the chamber, the plate being configured to support a substrate;

a deposition unit; and a UV annealing unit, the deposition unit and the UV annealing unit being configured to perform an in-situ process including a plurality of cycles on the substrate in the chamber, the plurality of cycles including a first cycle that includes depositing a first sacrificial layer on the substrate, depositing a first oxide layer on the first sacrificial layer, and performing a first annealing process on the substrate after the depositing the first oxide layer, the plurality of cycles including a second cycle that includes depositing an additional sacrificial layer on the first oxide layer, depositing an additional oxide layer on the additional sacrificial layer, and performing an additional annealing process on the substrate after the depositing the additional oxide layer, the additional annealing process being different than the first annealing process.

17. The deposition apparatus of claim 16, wherein the deposition unit includes an inlet for providing gas to the chamber, an outlet for removing gas from the chamber, and an electrode configured to convert gas in the chamber into a plasma.

18. The deposition apparatus of claim 17, wherein the UV annealing unit is configured to perform the first annealing process on the first oxide layer during the first cycle, the deposition unit is configured to form the additional sacrificial layer directly on the first oxide layer during the second cycle such that the additional sacrificial layer is a second sacrificial layer, the deposition unit is configured to form the additional oxide layer directly on the second sacrificial layer such that the additional oxide layer is a second oxide layer, the UV annealing unit is configured is configured to perform the additional annealing process on the second oxide layer during the second cycle, and the deposition unit is configured to form the first and second oxide layers to have thicknesses that are less than the first and second sacrificial layers, respectively.

19. The deposition apparatus of claim 17, the deposition unit is configured to form a second sacrificial layer on the first oxide layer during and a second oxide layer on the second sacrificial layer during a second sub-cycle portion of the first cycle, the UV annealing unit is configured is configured to perform the first annealing process on the first oxide layer during a first sub-cycle portion of the first cycle, the UV annealing unit is configured to skip an annealing process during the second sub-cycle portion of the first cycle, the deposition unit is configured to form the additional sacrificial layer directly on the second oxide layer during a third sub-cycle portion of the second cycle such that the additional sacrificial layer is a third sacrificial layer, the deposition unit is configured to form the additional oxide layer directly on the third sacrificial layer such that the additional oxide layer is a third oxide layer, the UV annealing unit is configured is configured to perform the additional annealing process on the third oxide layer during the third sub-cycle portion of the second cycle, the UV annealing unit is configured to skip the annealing process during a remaining portion of the second cycle after the third sub-cycle portion, and the deposition unit is configured to form the first to third oxide layers to have thicknesses that are less than the first to third sacrificial layers, respectively.

20. The deposition apparatus of claim 17, wherein each of the plurality of cycles include a plurality of sub-cycles, the deposition unit is configured to form a stacked structure that includes an oxide layer on a sacrificial layer during each sub-cycle among the plurality of sub-cycles, the U V annealing unit is configured to perform an annealing process on the oxide layer of the stacked structure in at least two of the plurality of sub-cycles for each of the plurality of cycles, and the UV annealing unit is configured to skip the annealing process during at least one sub-cycle for each of the plurality of cycles.

* * * * *